United States Patent
Fovell et al.

(10) Patent No.: US 8,596,336 B2
(45) Date of Patent: Dec. 3, 2013

(54) SUBSTRATE SUPPORT TEMPERATURE CONTROL

(75) Inventors: Richard Fovell, San Jose, CA (US); Paul Brillhart, Pleasanton, CA (US); Sang In Yi, Sunnyvale, CA (US); Anisul H. Khan, Santa Clara, CA (US); Jivko Dinev, Santa Clara, CA (US); Shane Nevil, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1347 days.

(21) Appl. No.: 12/132,101

(22) Filed: Jun. 3, 2008

(65) Prior Publication Data

US 2009/0294101 A1    Dec. 3, 2009

(51) Int. Cl.
*F22B 37/00*    (2006.01)
*G05D 9/00*    (2006.01)
*B05C 11/00*    (2006.01)

(52) U.S. Cl.
USPC ............................ 165/11.1; 165/301; 118/666

(58) Field of Classification Search
USPC .................................. 165/11.1, 301; 118/666
See application file for complete search history.

(56) References Cited

U.S. PATENT DOCUMENTS

| | | | | |
|---|---|---|---|---|
| 5,038,496 A | * | 8/1991 | Mishina et al. | 34/78 |
| 5,320,982 A | * | 6/1994 | Tsubone et al. | 361/233 |
| 5,505,781 A | * | 4/1996 | Omori et al. | 118/726 |
| 5,937,541 A | * | 8/1999 | Weigand et al. | 34/92 |
| 5,948,283 A | * | 9/1999 | Grosshart | 118/666 |
| 5,950,723 A | * | 9/1999 | Heimanson et al. | 165/80.1 |
| 5,992,046 A | * | 11/1999 | Weigand et al. | 34/493 |
| 5,996,242 A | * | 12/1999 | Matsumoto et al. | 34/76 |
| 6,019,848 A | * | 2/2000 | Frankel et al. | 118/715 |
| 6,032,382 A | * | 3/2000 | Matsumoto et al. | 34/78 |
| 6,045,624 A | * | 4/2000 | Kamikawa et al. | 134/21 |
| 6,086,677 A | * | 7/2000 | Umotoy et al. | 118/715 |
| 6,108,932 A | * | 8/2000 | Chai | 34/76 |
| 6,190,459 B1 | * | 2/2001 | Takeshita et al. | 118/715 |

(Continued)

FOREIGN PATENT DOCUMENTS

| | | |
|---|---|---|
| JP | 09-036097 | 2/1997 |
| JP | 11-184539 A | 7/1999 |

(Continued)

OTHER PUBLICATIONS

International Search Report and Written Opinion mailed Jan. 21, 2010 for PCT Application No. PCT/US2009/045629.

(Continued)

*Primary Examiner* — Ljiljana Ciric
(74) *Attorney, Agent, or Firm* — Moser Taboada; Alan Taboada

(57) ABSTRACT

Apparatus for controlling the temperature of a substrate support may include a first heat transfer loop and a second heat transfer loop. The first heat transfer loop may have a first bath with a first heat transfer fluid at a first temperature. The second heat transfer loop may have a second bath with a second heat transfer fluid at a second temperature. The first and second temperatures may be the same or different. First and second flow controllers may be provided for respectively providing the first and second heat transfer fluids to a substrate support. One or more return lines may couple one or more outlets of the substrate support to the first and second baths for returning the first and second heat transfer fluids to the first and second baths.

23 Claims, 5 Drawing Sheets

(56) References Cited

U.S. PATENT DOCUMENTS

| | | | |
|---|---|---|---|
| 6,216,364 B1* | 4/2001 | Tanaka et al. | 34/69 |
| 6,254,683 B1* | 7/2001 | Matsuda et al. | 118/500 |
| 6,290,274 B1* | 9/2001 | Montoya | 279/3 |
| 6,320,736 B1* | 11/2001 | Shamouilian et al. | 361/234 |
| 6,354,311 B1* | 3/2002 | Kimura et al. | 134/61 |
| 6,409,838 B1* | 6/2002 | Sakai | 118/725 |
| 6,596,093 B2* | 7/2003 | DeYoung et al. | 134/36 |
| 6,602,351 B2* | 8/2003 | DeYoung et al. | 134/36 |
| 6,660,096 B2* | 12/2003 | Takeshita et al. | 118/726 |
| 6,746,543 B2* | 6/2004 | Kamikawa et al. | 134/26 |
| 6,808,567 B2* | 10/2004 | Takeshita et al. | 118/715 |
| 6,821,380 B2* | 11/2004 | Namose | 165/301 |
| 6,853,953 B2* | 2/2005 | Brcka et al. | 700/108 |
| 7,141,274 B2* | 11/2006 | Wang et al. | 118/666 |
| 7,156,951 B1* | 1/2007 | Gao et al. | 118/724 |
| 7,235,137 B2* | 6/2007 | Kitayama et al. | 118/724 |
| 7,479,463 B2* | 1/2009 | Kulp et al. | 438/781 |
| 7,517,498 B2* | 4/2009 | Fredrick | 422/68.1 |
| 7,900,373 B2* | 3/2011 | Reitinger | 118/712 |
| 2001/0025431 A1* | 10/2001 | Kitano et al. | 34/406 |
| 2001/0052359 A1* | 12/2001 | Ikeda | 137/87.06 |
| 2002/0130276 A1* | 9/2002 | Sogard | 250/492.2 |
| 2002/0135389 A1* | 9/2002 | Melgaard et al. | 324/760 |
| 2002/0166256 A1* | 11/2002 | Samoilov et al. | 34/406 |
| 2003/0015294 A1 | 1/2003 | Wang | |
| 2003/0155939 A1 | 8/2003 | Lutz et al. | |
| 2004/0045184 A1* | 3/2004 | Takeshita et al. | 34/218 |
| 2004/0123484 A1* | 7/2004 | Yoshikawa et al. | 34/410 |
| 2005/0217583 A1 | 10/2005 | Cole, Sr. et al. | |
| 2006/0023395 A1 | 2/2006 | Hsiao et al. | |
| 2007/0039942 A1 | 2/2007 | Leung et al. | |
| 2007/0081295 A1 | 4/2007 | Brillhart et al. | |
| 2007/0081296 A1 | 4/2007 | Brillhart et al. | |
| 2007/0089834 A1* | 4/2007 | Brillhart et al. | 118/724 |
| 2007/0091538 A1* | 4/2007 | Buchberger et al. | 361/234 |
| 2007/0091539 A1* | 4/2007 | Buchberger et al. | 361/234 |
| 2007/0139856 A1 | 6/2007 | Holland et al. | |
| 2007/0165356 A1 | 7/2007 | Nguyen et al. | |
| 2008/0127508 A1* | 6/2008 | Ohno et al. | 34/61 |

FOREIGN PATENT DOCUMENTS

| | | |
|---|---|---|
| JP | 2000-216140 A | 8/2000 |
| JP | 2006-245621 | 9/2006 |
| WO | WO 2004/093167 A2 | 10/2004 |

OTHER PUBLICATIONS

Office Action from the Japanese Patent Office received Feb. 6, 2013 for Japanese Patent Application No. 2011-512542.

* cited by examiner

SUBSTRATE SUPPORT TEMPERATURE CONTROL

BACKGROUND

1. Field

Embodiments of the present invention generally relate to semiconductor processing, and more particularly, to apparatus for controlling the temperature of a substrate support.

2. Description of the Related Art

As the critical dimensions for semiconductor devices continue to shrink, there is an increased need for semiconductor processing equipment that can uniformly process a semiconductor substrate over a narrow process window. For example, during many fabrication processes, such as etching, deposition, or the like, the temperature of a substrate during the process is a critical factor in process control, such etching a substrate to an appropriate depth or dimension.

In a semiconductor process chamber, the substrate temperature can be controlled or maintained by a temperature control apparatus. This apparatus may include, for example, an energy exchange system, wherein an energy exchanging medium is circulated through a substrate support. Using this system the substrate support may be cooled and/or heated to a desired temperature.

Unfortunately, changes in temperature of the substrate during an individual process step is not feasible, due to the slow ramp up and ramp down time of the energy exchange system's temperature. Moreover, changing temperature between process steps is also time consuming due to the slow ramp up and ramp down time.

Hence, there is a need in the art for an apparatus that can more rapidly cool or heat a substrate to a desired temperature.

SUMMARY

Methods and apparatus for controlling the temperature of a substrate support are provided herein. In some embodiments, an apparatus for controlling the temperature of a substrate support may include a first heat transfer loop and a second heat transfer loop. The first heat transfer loop may have a first bath with a first heat transfer fluid at a first temperature. The second heat transfer loop may have a second bath with a second heat transfer fluid at a second temperature. The first temperature may be the same or different than the second temperature. First and second flow controllers may be provided for respectively providing the first and second heat transfer fluids to a substrate support. One or more return lines may couple one or more outlets of the substrate support to the first and second baths for returning the first and second heat transfer fluids to the first and second baths. The first and second flow controllers may control the temperature of the substrate base by mixing the first and second fluids or by supplying the first and second fluids to the substrate support in flow pulses of sufficient duration to provide the required heat transfer for substrate temperature control.

In some embodiments, the first and second heat transfer fluids may be mixed prior to entering the substrate support. Alternatively, in some embodiments, the first and second heat transfer fluids may not mix prior to entering the substrate support. The first and second heat transfer fluids may exit the substrate support via one or more outlets coupled to one or more return lines. In some embodiments, the first and second heat transfer fluids may exit the substrate via one outlet coupled to one return line, the return line further coupled to the first and second baths. Alternatively, in some embodiments, the first heat transfer fluids may exit the substrate support via a first outlet coupled to a first return line and the second heat transfer fluid may exit the substrate support via a second outlet coupled to a second return line, wherein the first return line may be coupled to the first bath and the second return line may be coupled to the second bath.

In another aspect of the invention, methods for controlling a temperature of a substrate support are provided. In some embodiments, a method for controlling a temperature of a substrate support may include flowing a first heat transfer fluid having a first temperature from a first bath to a substrate support and flowing a second heat transfer fluid having a second temperature from a second bath to a substrate support. The first and the second temperatures may be the same or different. The first and second heat transfer fluids are then returned to the first and second baths.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
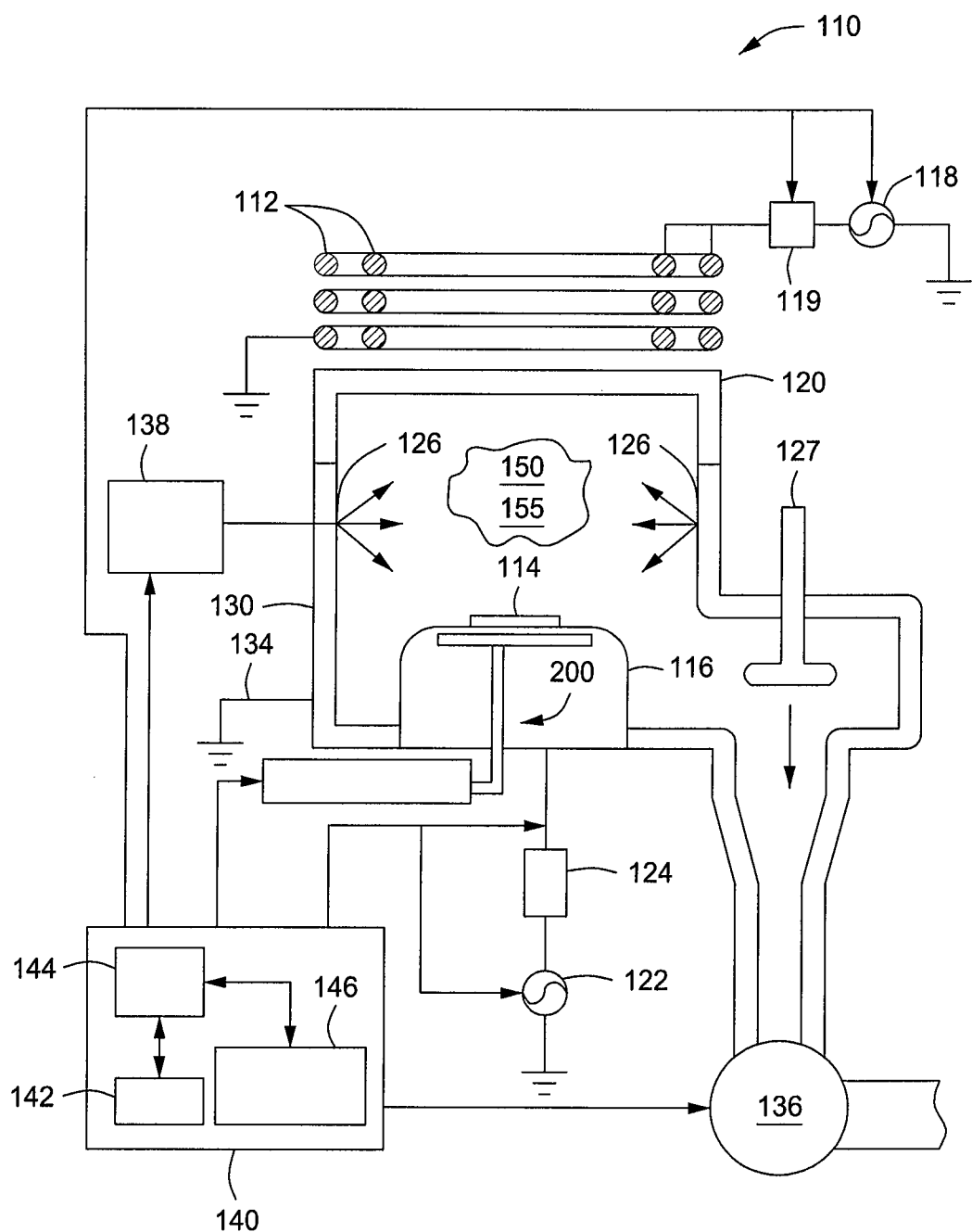
FIG. 1 depicts a process chamber having a heat transfer apparatus in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide apparatus and methods for controlling the temperature of a substrate support (and a substrate supported thereon). The inventive apparatus and methods may advantageously facilitate rapid temperature control of the substrate support as compared to conventional methods and apparatus. The inventive apparatus and methods may improve processing of substrates. In some embodiments, the inventive apparatus and methods may be utilized in a process chamber of a substrate processing system, such as an etch chamber, a reactive ion etch (RIE) chamber, a chemical vapor deposition (CVD) chamber, a plasma enhanced CVD (PECVD) chamber, a physical vapor deposition (PVD) chamber, a thermal processing chamber, or the like. The invention generally may be utilized in applications that where rapid substrate temperature control is desired.

For example, FIG. 1 depicts a schematic diagram of an exemplary etch reactor 100 having a substrate support temperature control apparatus 200 that may be used to practice portions of the invention. The reactor 100 includes a process chamber 110 having a substrate support pedestal 116 within a conductive body (wall) 130, and a controller 140.

The chamber 110 may be supplied with a dielectric ceiling 120. An antenna comprising at least one inductive coil element 112 may be disposed above the ceiling 120 (two coaxial elements 112 are shown). The inductive coil element 112 may be coupled through a first matching network 119 to a plasma power source 118.

The support pedestal (cathode) 116 may be coupled through a second matching network 124 to a biasing power source 122. The biasing power may be either continuous or pulsed power. In other embodiments, the biasing power source 122 may be a DC or pulsed DC source.

A controller 140 includes a central processing unit (CPU) 144, a memory 142, and support circuits 146 for the CPU 144. The controller 140 facilitates control of the components of the chamber 110 and, as such, of the processes performed therein, as discussed below in further detail.

In operation, a semiconductor substrate 114 may be placed on the pedestal 116 and process gases supplied from a gas panel 138 through entry ports 126 to form a gaseous mixture 150 within the chamber 110. The gaseous mixture 150 may be excited into a plasma 155 in the chamber 110 by applying power from the plasma source 118 and biasing power source 122 to the inductive coil element 112 and the cathode 116, respectively. The pressure within the interior of the chamber 110 may be controlled using a throttle valve 127 and a vacuum pump 136. Typically, the chamber wall 130 is coupled to an electrical ground 134. The temperature of the wall 130 may be controlled using liquid-containing conduits (not shown) that run through the wall 130.

The temperature of the substrate 114 may controlled by controlling a temperature of the support pedestal 116. In some embodiments, the temperature control apparatus 200 may be utilized to control the temperature of the support pedestal 116. Using such thermal control, the substrate 114 may be maintained at a temperature of between about −20 and 150 degrees Celsius. The substrate support pedestal 116 may comprise any suitable substrate support having channels (not shown) formed therein for facilitating the flow of at least one heat transfer fluid therethrough. The channels may be configured in any suitable arrangement for efficient transfer of heat between the substrate support pedestal 116 and the heat transfer fluid. The temperature control apparatus 200 may be disposed outside of the chamber 110 or partially within the chamber 110.

The temperature control apparatus 200 generally may include two chillers, or baths, coupled to the substrate support pedestal 116. The two chillers may be maintained at two different temperatures. The chillers provide heat transfer fluids at the respective temperatures that may be mixed as desired to provide any temperature between the two temperatures based upon the mixing ratio of the two heat transfer fluids. The heat transfer fluids may generally be any suitable heat transfer fluid. Examples of suitable heat transfer fluids include water-based mixtures, such as Galden® (available from Solvay S. A.) or Fluorinert™ (available from 3M Company). Flow controllers may be provided to each chiller to respectively control the amount of heat transfer fluid provided to the substrate support pedestal 116. Thus, any desired change in processing temperature may be implemented rapidly, limited only by the speed of the actuators in the flow controllers controlling the flow.

Figure 2:
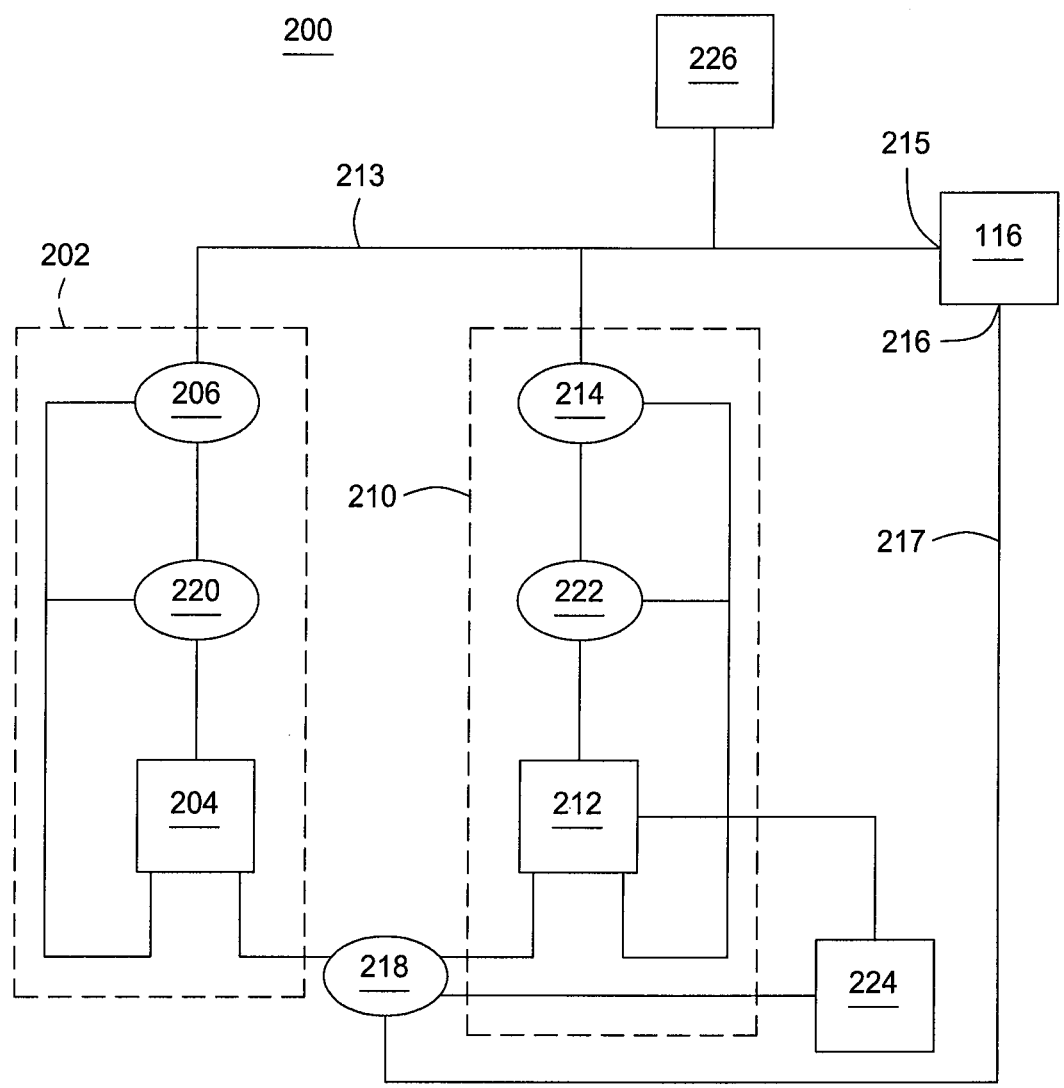
FIG. 2 depicts a heat transfer apparatus in accordance with some embodiments of the present invention.

For example, in some embodiments, and as depicted in FIG. 2, the temperature control apparatus 200 may include a first heat transfer loop 202 and a second heat transfer loop 210. The first heat transfer loop 202 may include a first bath 204 and a first flow controller 206. A first heat transfer fluid may be substantially maintained in the first bath 204 at a first temperature. The first flow controller 206 may be coupled to the first bath 204 to provide the first heat transfer fluid to the substrate support pedestal 116. The second heat transfer loop 210 may include a second bath 212 and a second flow controller 214. A second heat transfer fluid may be substantially maintained in the second bath 212 at a second temperature. The second temperature may be the same or different than the first temperature. The second flow controller 214 may be coupled to the second bath 212 to provide the second heat transfer fluid to the substrate support pedestal 116. A return line 217 may couple an outlet 216 of the substrate support pedestal 116 to the first and second baths 204, 212 for returning the first and second heat transfer fluids to the first and second baths 204, 212. The flow controllers 206,214 may be any suitable flow control device, such as a flow splitter, a variable flow splitter, a mass flow controller, or the like. The flow controllers 206, 214 may be disposed near the chamber 110, or in some embodiments, may be disposed inside of the chamber 110.

In some embodiments, the first and second heat transfer fluids may be mixed in a conduit 213 prior to entering an inlet 215 of the substrate support pedestal 116. The mixed heat transfer fluids (hereinafter referred to as mixed fluids) may have a temperature anywhere between and including the respective individual temperatures of the first and second baths 204, 212. In some embodiments, the conduit 213 may be coupled to a temperature sensor 226 for monitoring the temperature of the mixed fluids. The temperature sensor may be coupled to a controller (such as controller 140 shown in FIG. 1) for providing feedback to control the temperature of the mixed fluids (for example, by controlling the mixing ratio of the two heat transfer fluids).

The mixed fluids exit the substrate support pedestal 116 through the outlet 216 and are returned to the first and second baths via a return line 217. In some embodiments, the return line 217 may be coupled to the first and second baths 204, 212 via a return line flow controller 218 for controlling how the mixed fluids get distributed between the first and second baths 204, 212. The return line flow controller 218 may comprise a flow splitter, a variable flow splitter, a mass flow controller, or the like. In one embodiment, the return line flow controller 218 is a flow splitter.

Optionally, the first heat transfer loop 202 may further include a first intermediate flow splitter 220 disposed between the first bath 204 and the first flow controller 206. The first intermediate flow splitter 220 may be utilized to split the flow of the first heat transfer fluid between the first flow controller 206 and the first bath 204. In some embodiments, the first heat transfer fluid may be split in a mass ratio of about 1:4 by the first intermediate flow controller 206, wherein about 20% of first heat transfer fluid may flow to the first flow controller 206, and 80% of the first heat transfer fluid may be returned to the first bath 204. The first intermediate flow splitter 220 may facilitate mixing of the heat transfer fluid in the first bath 204, thereby facilitating more uniform incorporation of the return flow of mixed fluids from the substrate support pedestal 116.

In some embodiments, the first flow controller 206 may be a flow splitter for splitting the flow of the first heat transfer fluid between the substrate support pedestal 116 and the first bath 204. In some embodiments, the first heat transfer fluid may be split in a mass ratio of about 0 to 100 percent at the first flow controller 206, wherein about 0 to 100 percent of the first heat transfer fluid may flow to the substrate support pedestal 116 and the remaining 0 to 100 percent may be returned to the first bath 204.

Optionally, the second heat transfer loop 210 may further comprise a second intermediate flow splitter 222 disposed between the second bath 212 and the second flow controller 214. The second intermediate flow splitter 222 may be utilized to split the flow of the second heat transfer fluid between the second flow controller 214 and the second bath 212. In some embodiments, the second heat transfer fluid may be split in a mass ratio of about 1:4 by the second intermediate flow splitter 222, wherein about 20% of second heat transfer fluid may flow to the second flow controller 206, and 80% of the second heat transfer fluid may be returned to the second bath 212. The second intermediate flow splitter 222 may facilitate mixing of the heat transfer fluid in the second bath 212, thereby facilitating more uniform incorporation of the return flow of mixed fluids from the substrate support pedestal 116.

In some embodiments, the second flow 214 controller may be a flow splitter for splitting the flow of the second heat transfer fluid between the substrate support pedestal 116 and the second bath 212. In some embodiments, the second heat transfer fluid may be split in a mass ratio of about 0 to 100 percent at the second flow controller 214, wherein about 0 to 100 percent of the second heat transfer fluid may flow to the substrate support pedestal 116 and the remaining 0 to 100 percent may be returned to the second bath 212.

In some embodiments, the temperature control apparatus 200 may further include a controller 224 for controlling the liquid level inside the first and second baths 204, 212. The controller 224 may be coupled to the return line flow controller 218 for controlling the quantity of mixed fluids returning the first and second baths 204, 212. The controller may be coupled to the second bath 212 for monitoring the fluid level inside the second bath 212. By monitoring the level of the heat transfer fluid in the second bath 212, the controller may control the return line flow controller 218 to maintain a desired liquid level in the second bath 212. As there is a fixed amount of total heat transfer fluid within the system, the remainder of the mixed fluids flowing to the first bath 204 (and the liquid level thereof) will be similarly controlled. Alternatively, the controller 224 can be coupled to the return line flow controller 218 and the first bath 204 for performing the same function as described above.

In operation, the first and second heat transfer fluids (at first and second respective temperatures) may be flowed from the first and second baths 204, 212 to the inlet 215 of the substrate support pedestal 116 via the conduit 213. The first and second heat transfer fluids may be mixed in the conduit 213 prior to entering the inlet of the substrate support pedestal 116. The mixed fluids may exit the substrate support pedestal 116 through the outlet 216 and may be returned to the first and second baths 204, 212 via the return line 217.

Figure 3:
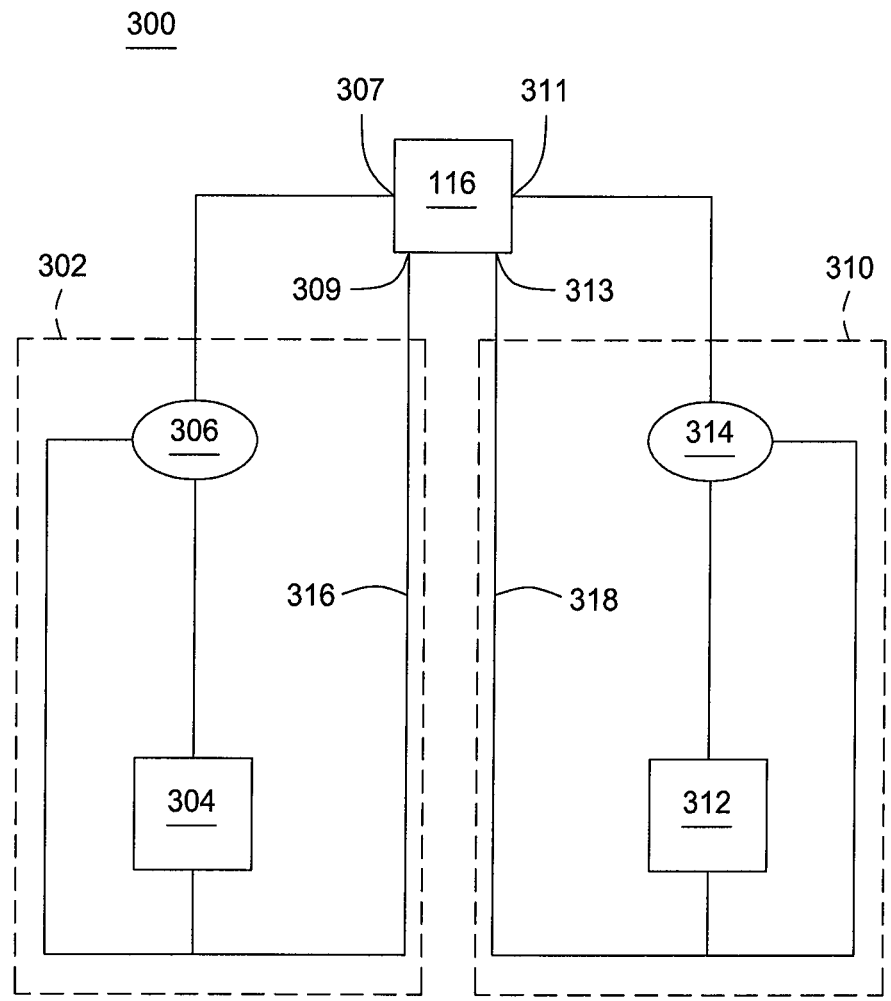
FIG. 3 depicts a heat transfer apparatus in accordance with some embodiments of the present invention.

Alternatively, rather than mixing the heat transfer fluids prior to entering the substrate support pedestal 116, a temperature control apparatus may be provided that maintains the heat transfer fluids separate from each other. For example, FIG. 3 depicts a temperature control apparatus 300 that may be utilized in place of the temperature control apparatus 200 described above. In some embodiments, the temperature control apparatus 300 may include a first heat transfer loop 302 and a second heat transfer loop 310. The first heat transfer loop 302 may include a first bath 304 for substantially maintaining a first heat transfer fluid at a first temperature. A first flow controller 306 may be coupled to the first bath 304 to provide the first heat transfer fluid to the substrate support pedestal 116 at a controlled rate. The second heat transfer loop 310 may include a second bath 312 for substantially maintaining a second heat transfer fluid at a second temperature. A second flow controller 314 may be coupled to the second bath 312 to provide the second heat transfer fluid to the substrate support pedestal 116 at a controlled rate. A first return line 316 may be provided for coupling the substrate support pedestal 116 to the first bath 304. A second return line 318 may be provided for coupling the substrate support pedestal 116 to the second bath 314. The flow controllers 306, 314 may comprise any suitable flow controller as discussed above with respect to FIG. 2. The flow controllers 306, 314 may be disposed near the chamber 110, or in some embodiments, may be disposed inside of the chamber 110.

The first heat transfer fluid may enter the substrate support pedestal 116 via a first inlet 307 and the second heat transfer fluid may enter the substrate support pedestal via a second inlet 311. The first and second heat transfer fluids do not mix during passage through the substrate support pedestal 116. The first heat transfer fluid may exit the substrate support pedestal 116 via a first outlet 309. The outlet 309 may be coupled to the first bath 304 via the first return line 316. The second heat transfer fluid may exit the substrate support pedestal 116 via a second outlet 313. The second outlet 313 may be coupled to the second bath 312 via the second return line 318. In operation, the respective flows of the first and second heat transfer fluids may be controlled (for example, by the controller 140 shown in FIG. 1) to provide a desired temperature of the substrate support pedestal 116.

In some embodiments, the first flow controller 306 of the first heat transfer loop 302 may be a flow splitter for splitting the flow of the first heat transfer fluid between the substrate support pedestal 116 and the first bath 304. In some embodiments, the first heat transfer fluid may be split in a mass ratio of about 0 to 100 percent by the first flow controller 306, wherein about 0 to 100 percent of the first heat transfer fluid may flow to the substrate support pedestal 116 and the remaining 0 to 100 percent may be returned to the first bath 304.

In some embodiments, the second flow controller 314 of the second heat transfer loop 310 may be a flow splitter for splitting the flow of the second heat transfer fluid between the substrate support pedestal 116 and the second bath 312. In some embodiments, the second heat transfer fluid may be split in a mass ratio of about 0 to 100 percent at the second flow controller 314, wherein about 0 to 100 percent of the second heat transfer fluid may flow to the substrate support pedestal 116 and the remaining 0 to 100 percent may be returned to the second bath 312.

In operation, the first and second heat transfer fluids (at respective first and second temperatures) may be flowed from the first and second baths 304, 312 to respective inlets 309, 313 of the substrate support pedestal 116 via the inlets 307, 311. The first and second heat transfer fluids do not mix prior to entering the substrate support pedestal 116. The first and second fluids may exit the substrate support pedestal 116 through respective outlets 309, 313 and may be returned to the first and second baths 304, 312 via respective return lines 316, 318.

Figure 5:
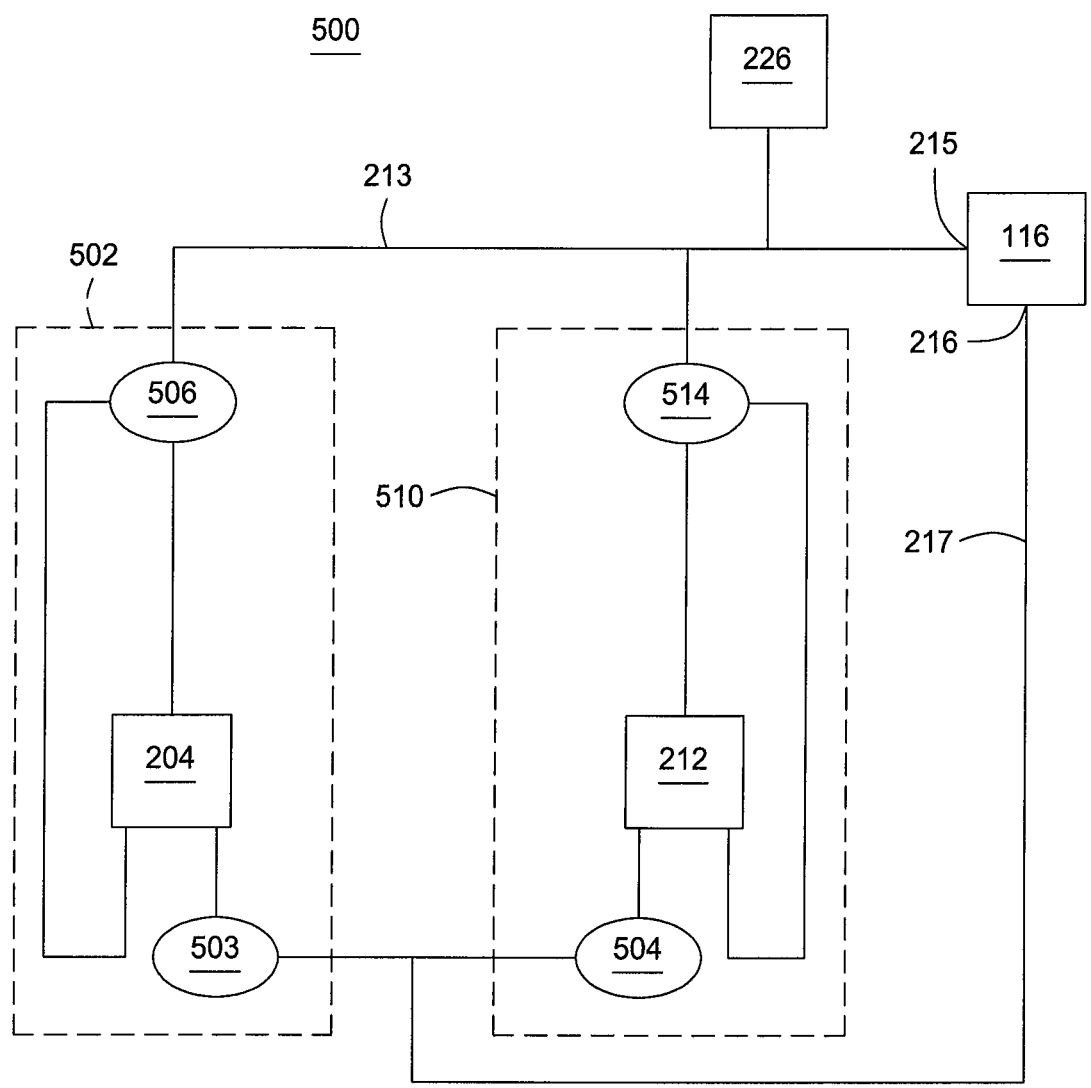
FIG. 5 depicts a heat transfer apparatus in accordance with some embodiments of the present invention.

The above embodiments of the present invention are illustrative only and may be varied in many ways while keeping within the scope of the present invention. For example, FIG. 5 depicts a heat transfer apparatus in accordance with some embodiments of the present invention. Elements in FIG. 5 that are identical to those previously discussed are labeled with the same reference numerals as used in the prior Figures.

As shown in FIG. 5, in some embodiments, a temperature control apparatus 500 may be provided having a first heat transfer loop 502 and a second heat transfer loop 510. The first heat transfer loop 502 may include a first bath 204 and a first flow controller 506. A first heat transfer fluid may be substantially maintained in the first bath 204 at a first temperature. The first flow controller 506 may be coupled to the first bath 204 to selectively provide the first heat transfer fluid to the substrate support pedestal 116 at a flow rate of between 0-100 percent.

The second heat transfer loop 510 may include a second bath 212 and a second flow controller 514. A second heat transfer fluid may be substantially maintained in the second bath 212 at a second temperature. The second temperature may be the same or different than the first temperature. The second flow controller 514 may be coupled to the second bath 212 to selectively provide the second heat transfer fluid to the substrate support pedestal 116 at a flow rate of between 0-100 percent.

The flow controllers 506, 514 may be any suitable flow control device, such as a flow splitter, a variable flow splitter, a mass flow controller, a valve, or the like, or any combinations thereof. In some embodiments, the flow controllers 506, 514 may each comprise a mass flow controller and two valves, wherein one valve may be disposed between the mass flow controller and the bath, and the other valve may be disposed between the mass flow controller and the conduit 213.

A conduit 213 is provided for coupling the first and second baths 204, 214 to the substrate support pedestal 116 via an inlet 215. A return line 217 may couple an outlet 216 of the substrate support pedestal 116 to the first and second baths 204, 212 for returning the first and second heat transfer fluids to the first and second baths 204, 212. A first return line flow controller 503 and a second return line flow controller 504 may be disposed in the return line 217. The first return line flow controller 503 may couple the substrate support 116 to the first bath 204. The second return line flow controller 504 may couple the substrate support 116 to the second bath 212. The return line flow controllers 503, 504 may be any suitable flow control device, such as a mass flow controller, a valve, or the like, or combinations thereof. In some embodiments, the first and second return line flow controllers 503, 504 are valves.

Returning to FIG. 1, in some embodiments, to facilitate control of the process chamber 110 and/or the temperature control apparatus 200 or the temperature control apparatus 300, as described above, the controller 140 may be one of any form of general-purpose computer processor that can be used in an industrial setting for controlling various chambers and sub-processors. The controller 140 may includes a memory 142, or computer-readable medium, a CPU 144, and support circuits 146. The memory 142 may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. The inventive methods for controlling the apparatus as described herein may generally stored in the memory 142 as a software routine, which, when executed, may control the etch reactor 100 to perform the inventive methods. The software routine may also be stored and/or executed by a second CPU (not shown) that is remotely located from the hardware being controlled by the CPU 144.

Figure 4:
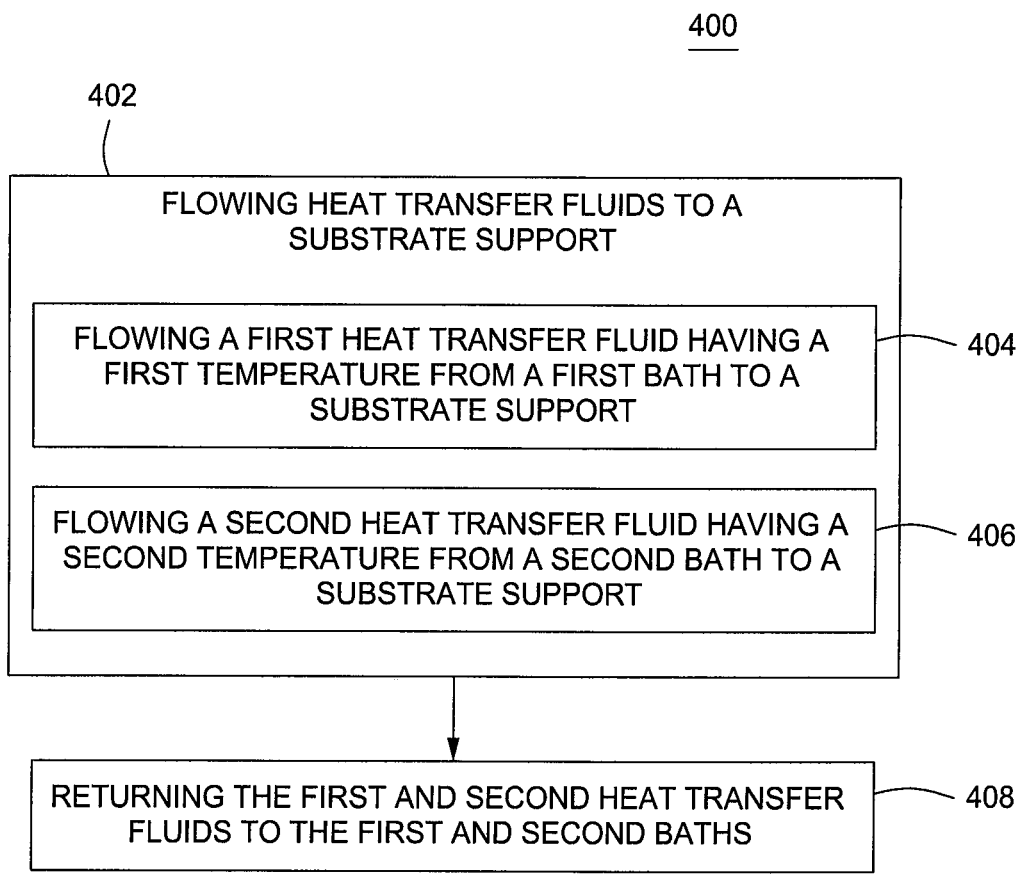
FIG. 4 depicts a method for controlling the temperature of a substrate support in accordance with some embodiments of the present invention.

FIG. 4 depicts a method 400 for controlling the temperature of a substrate support in accordance with some embodiments of the present invention. The method 400 is described with reference to FIGS. 2-3. The method 400 may be performed in any suitable semiconductor process chamber having a substrate support and a temperature control apparatus, as described above. In some embodiments, the substrate support may be configured to have one inlet and one outlet with one channel disposed therethrough, wherein at least two heat transfer fluids may be flowed therethrough (as described above with respect to FIG. 2). In some embodiments, the substrate support may have at least two or more inlets and at least two or more outlets. In some embodiments, the substrate support may further comprise at least two channels, wherein at least two heat transfer fluids may remain separated when flowing therethrough (as described above with respect to FIG. 3).

The method 400 begins at 402, where at least one heat transfer fluid may be flowed to a substrate support (such as substrate support pedestal 116). In some embodiments, a first heat transfer fluid having a first temperature may be flowed from a first bath to the substrate support pedestal 116, as depicted at 404, and a second heat transfer fluid having a second temperature may be flowed from a second bath to the substrate support, as depicted at 406. In some embodiments, the first and second heat transfer fluids may be mixed prior to entering the substrate support. Alternatively, in some embodiments, the first and second heat transfer fluids may not be mixed prior to entering the substrate support and may be maintained separate from each other within the substrate support.

In some embodiments, the flow rates of the first and second heat transfer fluids may be varied over time. The flow rates of either or both of the first and second heat transfer fluids may be varied between 0-100% of a maximum flow rate of the heat transfer apparatus described herein. For example, in some embodiments, the first and second temperatures may be the same, and the flow rates of the first and second heat transfer fluids may be different. This example may be applicable, for instance, for independently controlling the heating/cooling rate in different regions of the substrate support, such as, for example, an edge or a center of the substrate support.

In some embodiments, the flow of the first and second heat transfer fluids (having the same or different temperatures) may be pulsed to control the temperature of the substrate support. Such pulsing may be defined by a duty-cycle including at least a first period of time wherein the flow of one or both of the first and second heat transfer fluids may be provided at a first rate of between 0-100%, and a second period of time wherein the flow of one or both of the first and second heat transfer fluids may be provided at a second rate of between 0-100%, the first and second rates being different. The pulsing may include periods of pulsing, as described above, that pulse both of the first and second heat transfer fluids together, pulse either one of the first and second heat transfer fluids separately, or alternately pulse between the first and second heat transfer fluids in each period. Each pulse may last for an equal or different period of time. The number of pulses may be varied as suitable to facilitate temperature control over a desired period of time (e.g., a desired processing time). Such pulsing may facilitate transferring heat to or from a substrate support to control the temperature of the substrate support to a desired temperature setpoint.

For example, in some embodiments, it may be desired to rapidly cool the substrate support to a desired setpoint temperature. A heat transfer fluid at a temperature below the setpoint temperature may be supplied at a first flow rate for a first period of time. In some embodiments, as the temperature of the substrate support approaches the setpoint temperature, the flow rate of the heat transfer fluid may be stopped or lessened to a second flow rate, for a second period of time, and after the second period of time, the flow of the heat transfer fluid may be increased to back the first flow rate.

Alternatively, the duty cycle may vary the flow rate of the heat transfer fluid (or fluids) as the temperature of the substrate support approaches the setpoint temperature. For example, in some embodiments, the flow rate may be continuously on, and the flow rate continually decreased as the temperature of the substrate support approaches the setpoint temperature. In some embodiments, the flow rate may be increased or decreased to maintain the temperature of the substrate support at the setpoint temperature. It is contemplated that combinations of these methods may also be utilized to advantageously control the temperature of a substrate support to a desired temperature setpoint.

Next, at 408 the first and second heat transfer fluids exit the substrate support through one or more outlets and to return to the first and second baths via one or more return lines. In some embodiments, the first and second heat transfer fluids may exit the substrate support through one outlet and may be returned to the first and second baths via one return line. Alternatively, in some embodiments, the first and second heat transfer fluids may exit the substrate support through at least two outlets and may be returned to the first and second baths via at least two return lines.

Thus, embodiments of methods and apparatus for controlling the temperature of a substrate support have been provided herein. The inventive methods and apparatus may facilitate rapid change of temperature of a substrate support pedestal (and a substrate disposed thereon) during a process. The inventive methods and apparatus thus may facilitate faster changes between process steps having varying temperature requirements. Moreover, the inventive methods may enable individual process steps to involve changes of temperature due to the decreased response time necessary to change the temperature of the substrate support.

While the foregoing is directed to embodiments of the present invention, other and further embodiments of the invention may be devised without departing from the basic scope thereof, and the scope thereof is determined by the claims that follow.

What is claimed is:

1. An apparatus to control the temperature of a substrate support, comprising:
   a first heat transfer loop having a first bath with a first heat transfer fluid at a first temperature with a first flow controller to provide the first heat transfer fluid to the substrate support;
   a second heat transfer loop having a second bath with a second heat transfer fluid at a second temperature with a second flow controller to provide the second heat transfer fluid to the substrate support, wherein the first heat transfer fluid and the second heat transfer fluid can be provided to the substrate support simultaneously; and
   one or more return lines coupling the substrate support to the first bath and the second bath to return the first heat transfer fluid and the second heat transfer fluid to the first bath and the second bath.

2. The apparatus of claim 1, wherein the first temperature is not equal to the second temperature.

3. The apparatus of claim 1, wherein the first heat transfer fluid and the second heat transfer fluid are mixed in a conduit prior to entering the substrate support.

4. The apparatus of claim 3, further comprising:
   a temperature sensor coupled to the conduit.

5. The apparatus of claim 3, wherein the one or more return lines is one return line coupling the substrate support and the first bath and second bath.

6. The apparatus of claim 5, further comprising:
   a return line flow controller disposed in the one return line.

7. The apparatus of claim 6, further comprising:
   a controller coupled to the return line flow controller to monitor the fluid level inside at least one of the first bath or the second bath.

8. The apparatus of claim 5, further comprising:
   a first return line flow controller disposed in the one return line to control flow of the heat transfer fluid from the one return line to the first bath; and
   a second return line flow controller disposed in the one return line to control flow of the heat transfer fluid from the one return line to the second bath.

9. The apparatus of claim 1, further comprising:
   a first intermediate flow controller disposed between the first bath and the first flow controller, the first intermediate flow controller comprising a flow splitter to split a flow of the first heat transfer fluid between the first flow controller and the first bath, wherein the first flow controller comprises a flow splitter to split the flow of the first heat transfer fluid between the substrate support and the first bath; and
   a second intermediate flow controller disposed between the second bath and the second flow controller, the second intermediate flow controller comprising a flow splitter to split a flow of the second heat transfer fluid between the second flow controller and the second bath, wherein the second flow controller comprises a flow splitter to split the flow of the second heat transfer fluid between the substrate support and the second bath.

10. The apparatus of claim 1, wherein the first heat transfer fluid and the second heat transfer fluid do not mix upon entering the substrate support.

11. The apparatus of claim 10, wherein the one or more return lines comprises a first return line coupling the substrate support to the first bath, and a second return line coupling the substrate support to the second bath.

12. The apparatus of claim 11, wherein the first flow controller of the first heat transfer loop comprises:
   a flow splitter to split the flow of the first heat transfer fluid between the substrate support and the first bath.

13. The apparatus of claim 11, wherein the second flow controller of the second heat transfer loop comprises:
   a flow splitter to split the flow of the second heat transfer fluid between the substrate support and the second bath.

14. A method for controlling a temperature of a substrate support comprising:
   flowing a first heat transfer fluid having a first temperature from a first bath with a first flow controller in a first heat transfer loop, to the substrate support;
   flowing a second heat transfer fluid having a second temperature from a second bath with a second flow controller in a second heat transfer loop to a substrate support, wherein the first heat transfer fluid and the second heat transfer fluid can be provided to the substrate support simultaneously; and
   returning the first heat transfer fluid and the second heater fluid to the first bath and the second bath using one or more return lines coupling the substrate support to the first bath and second bath.

15. The method of claim 14, wherein the first temperature is not equal to the second temperature.

16. The method of claim 14, further comprising:
mixing the first heat transfer fluid and the second transfer fluid prior to entering the substrate support.

17. The method of claim 16, further comprising:
returning the mixed first and second heat transfer fluids to the first bath and the second bath.

18. The method of claim 14, further comprising:
splitting a flow of the first heat transfer fluid to provide a portion of the flow of the first heat transfer fluid to the substrate support and to return a remainder of the flow of the first heat transfer fluid to the first bath.

19. The method of claim 18, further comprising:
splitting a flow of the second heat transfer fluid to provide a portion of the flow of the second heat transfer fluid to the substrate support and to return a remainder of the flow of the second heat transfer fluid to the second bath.

20. The method of claim 14, further comprising:
flowing the first heat transfer fluid and the second heat transfer fluid, wherein the first heat transfer fluid and the second heat transfer fluid are not mixed.

21. The method of claim 20, further comprising:
returning the first heat transfer fluid to the first bath; and
returning the second heat transfer fluid to the second bath.

22. The method of claim 21, further comprising:
splitting a flow of the first heat transfer fluid to provide a portion of the flow of the first heat transfer fluid to the substrate support and to return a remainder of the flow of the first heat transfer fluid to the first bath; and
splitting a flow of the second heat transfer fluid to provide a portion of the flow of the second heat transfer fluid to the substrate support and to return a remainder of the flow of the second heat transfer fluid to the second bath.

23. The method of claim 20, further comprising:
flowing the first heat transfer fluid at a first flow rate; and
flowing the second heat transfer fluid at a second flow rate, wherein the second flow rate is different than the first flow rate.

\* \* \* \* \*